(12) United States Patent
Kiyama et al.

(10) Patent No.: US 8,338,853 B2
(45) Date of Patent: Dec. 25, 2012

(54) SUBSTRATE FOR FORMING LIGHT-EMITTING LAYER, LIGHT EMITTER AND LIGHT-EMITTING SUBSTANCE

(75) Inventors: Akira Kiyama, Toyota (JP); Rentaro Mori, Kasugai (JP); Hiroya Inaoka, Toyota (JP); Masayuki Ichiyanagi, Toyota (JP); Nobuhiko Sawaki, Nagoya (JP); Yoshio Honda, Nagoya (JP); Yasuyuki Yanase, Gifu-ken (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 842 days.

(21) Appl. No.: 11/990,924

(22) PCT Filed: Aug. 24, 2006

(86) PCT No.: PCT/JP2006/317157
§ 371 (c)(1),
(2), (4) Date: Feb. 25, 2008

(87) PCT Pub. No.: WO2007/024017
PCT Pub. Date: Mar. 1, 2007

(65) Prior Publication Data
US 2009/0250711 A1    Oct. 8, 2009

(30) Foreign Application Priority Data

Aug. 25, 2005  (JP) ................................. 2005-244354

(51) Int. Cl.
*H01L 33/00* (2010.01)
(52) U.S. Cl. ................................. 257/103; 257/E33.003
(58) Field of Classification Search .................. 257/527, 257/627, E21.108, E21.116, 94, 103, E33.003, 257/E33.013, E33.027; 438/47
See application file for complete search history.

(56) References Cited

U.S. PATENT DOCUMENTS
6,432,521 B1 * 8/2002 Yagi et al. ..................... 428/209
(Continued)

FOREIGN PATENT DOCUMENTS
JP      8-310900      11/1996
(Continued)

OTHER PUBLICATIONS
Machine Translation of JP2004-193498.*
(Continued)

*Primary Examiner* — Matthew Landau
*Assistant Examiner* — Latanya N Crawford
(74) *Attorney, Agent, or Firm* — Finnegan, Henderson, Farabow, Garrett & Dunner, LLP (57) ABSTRACT

Light emitters and substrates for light emitters are provided to improve light-emitting efficiency and achieve improvement in crystal quality. A light emitter includes a single-crystal substrate, an oriented microcrystal layer, and a light-emitting layer. The light-emitting layer is made of a nitride semiconductor by means of a vapor-phase growth method. In the oriented microcrystal layer, the proportion of crystals, in which one of crystal axes is oriented with respect to the single-crystal substrate, is 5-9 out of 10 crystals. An average diameter of the crystal grains of the respective crystals, contained in the oriented microcrystal layer, is 1-1,000 nm. A light emitter may be equipped with an intermediate layer, a light-emitting layer, and a clad layer. These layers are formed on the oriented microcrystal layer by a vapor-phase growth method. The light-emitting layer contains microcrystal grains whose average grain diameter is 1-1,000 nm.

12 Claims, 4 Drawing Sheets

U.S. PATENT DOCUMENTS

| | | | |
|---|---|---|---|
| 6,524,932 B1* | 2/2003 | Zhang et al. | 438/459 |
| 7,221,001 B2* | 5/2007 | Okuyama et al. | 257/95 |
| 7,399,693 B2* | 7/2008 | Sekiguchi et al. | 438/607 |
| 7,659,190 B2* | 2/2010 | Shimizu et al. | 438/602 |
| 2001/0010941 A1* | 8/2001 | Morita | 438/46 |
| 2002/0113235 A1* | 8/2002 | Udagawa | 257/59 |
| 2002/0163005 A1* | 11/2002 | Kojima et al. | 257/80 |
| 2003/0207125 A1* | 11/2003 | Sunakawa et al. | 428/428 |
| 2004/0041156 A1* | 3/2004 | Tsuda et al. | 257/79 |
| 2004/0094756 A1* | 5/2004 | Moon et al. | 257/13 |
| 2005/0017261 A1* | 1/2005 | Ishizaki | 257/103 |
| 2006/0022308 A1* | 2/2006 | Shimizu et al. | 257/613 |
| 2007/0164306 A1* | 7/2007 | Nakahata et al. | 257/103 |

FOREIGN PATENT DOCUMENTS

| | | |
|---|---|---|
| JP | 9-219540 | 8/1997 |
| JP | 9-235548 | 9/1997 |
| JP | 10-125608 | 5/1998 |
| JP | 11-46045 | 2/1999 |
| JP | 11-339681 | 12/1999 |
| JP | 2000-31588 | 1/2000 |
| JP | 2002-26387 | 1/2002 |
| JP | 2002-246646 | 8/2002 |
| JP | 2002-246697 | 8/2002 |
| JP | 2003-037287 | 2/2003 |
| JP | 2003-209062 | 7/2003 |
| JP | 2003-243702 | 8/2003 |
| JP | 2003-347585 | 12/2003 |
| JP | 2004-31657 | 1/2004 |
| JP | 2004-193498 | 7/2004 |
| WO | WO 02/103813 A1 | 12/2002 |
| WO | WO 2005/071720 A1 | 8/2005 |

OTHER PUBLICATIONS

International Search Report.
Notification of Reasons for Refusal for JP Appl. No. 2005-244354, received by Applicant's Japanese representative on Sep. 29, 2011.

* cited by examiner

SUBSTRATE FOR FORMING LIGHT-EMITTING LAYER, LIGHT EMITTER AND LIGHT-EMITTING SUBSTANCE

TECHNICAL FIELD

The present invention relates to a substrate for forming light-emitting layer, a light emitter and a light-emitting substance, and more particularly it relates to a substrate for forming light-emitting layer, a light emitter and a light-emitting substance whose light-emitting layer comprising a nitride semiconductor is formed by means of vapor-phase growth method.

BACKGROUND ART

As materials for fluorescent body, II-VI group semiconductors, such as ZnS, have been studied since a long time ago. However, II-VI group semiconductors have been associated with such a problem that the longevity degrades when they are turned into a highly excited state utilizing electron beam in order to achieve high luminance. Accordingly, the development of highly resistant material has been longed for.

As for highly-resistant fluorescent-body material, it is possible to name nitride semiconductor. Since nitride semiconductor is very stable physically and chemically, no such phenomenon occurs that the longevity degrades even when being turned into an intensely excited state by means of electron beam, and the like, and accordingly is one which can be expected as a highly-resistant fluorescent-body material. However, nitride semiconductor is such that the making of bulk single crystal from molten liquid is difficult. Accordingly, for the making of fluorescent body using nitride semiconductor, the following has been employed conventionally: a method of utilizing the growth of polycrystal powder (see Patent Publication No. 1: Japanese Unexamined Patent Publication (KOKAI) Gazette No. 9-235,548, for instance); and a method of utilizing a vapor-phase growth method (see Patent Publication No. 2: Japanese Unexamined Patent Publication (KOKAI) Gazette No. 11-339,681, for instance).

In this Patent Literature No. 1, there is disclosed a process for producing granular fluorescent body by means of heating a raw-material powder, which comprises gallium sulfide as a gallium compound not-including oxygen, indium sulfide as an indium compound not-including oxygen, and a sulfide of Zn or Mg as a doping substance not-including oxygen, in an ammonia atmosphere.

On the other hand, in Patent Literature No. 2, there is disclosed a technology for orienting a crystal axis in fluorescent crystal film in which a conductive film is formed on an insulated base plate; and a polycrystal-state fluorescent crystal film comprising $In_xGa_yAl_{1-x-y}N$: Zn, Si is grown on the conductive film by means of metalorganic gas-phase growth method (or MOCVD method) and thereafter by means of annealing treatment.

In the method that utilizes the powder set forth in aforementioned Patent Literature No. 1, it is possible to obtain nitride semiconductor in a large amount at low cost. However, in the method of heating gallium nitride or gallium oxide, and the like, in an ammonia atmosphere, there is such a problem that the crystal quality is poor, and accordingly it is blackened (or crystals themselves appear to be black) due to nitrogen deficiency so that the rise of luminance becomes difficult. Moreover, since the controllability of raw-material supply is low, and since there are limitations on the raw-material species, there is a limitation on improving the light-emitting efficiency.

On the other hand, in accordance with the method that utilizes the vapor-phase growth method disclosed in aforementioned Patent Literature No. 2, there is no such a problem that the crystal quality degrades due to blackening. Moreover, since the control of raw-material supply is easy, the control of making mixed crystal and the concentration control of impurities become feasible, and thereby the improvement of color rendering property or light-emitting efficiency becomes feasible. However, since a membrane-shaped fluorescent crystal film is formed by means of the vapor-phase growth method, it is difficult to microcrystallize it, and accordingly there is such a problem that it is not possible to improve the light-emitting efficiency extremely.

DISCLOSURE OF THE INVENTION

The present invention is one which has been done in view of the aforementioned circumstances, and its technical assignment to be solved is to provide a substrate for forming light-emitting layer, a light emitter and a light-emitting substance that make it possible to intend the improvement of light-emitting efficiency as well by microcrystallizing the light-emitting layer while utilizing a vapor-phase growth method being advantageous for improving the crystal quality, and the like.

A substrate, which solves the aforementioned assignment, for forming light-emitting layer comprises a single-crystal substrate; and an oriented microcrystal layer being formed on the single-crystal substrate; and the substrate being a substrate in which a light-emitting layer comprising a nitride semiconductor is formed on the oriented microcrystal layer by means of vapor-phase growth method, and is one which is characterized in that one of the crystal axes of 5-9 out of ten of respective crystals, which constitute said oriented microcrystal layer, is oriented in a specific direction with respect to said single-crystal substrate; and in that an average of the crystal grain diameters of the respective crystals, which constitute said oriented microcrystal layer, is adapted to being 1-1,000 nm.

A light emitter, which solves the aforementioned assignment, is such that it is equipped with the substrate for forming light-emitting layer, and a light-emitting layer, which is formed on said oriented microcrystal layer of the substrate for forming light-emitting layer by means of vapor-phase growth method, and which comprises a nitride semiconductor, and is one which is characterized in that said light-emitting layer is constituted of microcrystal grains whose average grain diameter is 1-1,000 nm.

In a preferable aspect of the light emitter, said light-emitting layer is formed on-said oriented microcrystal layer in such a form that said respective microcrystal grains are distributed in a dotted shape independently. In a preferable aspect, the light emitter is such that it is further equipped with an intermediate layer, which is formed on said oriented microcrystal layer by means of vapor-phase growth method, and which comprises a nitride semiconductor including a nucleus substance that becomes a starting point when said light-emitting layer grows; and the light-emitting layer is formed on the intermediate layer.

In a preferable aspect of the light emitter, said intermediate layer is such that a band gap energy is greater than that of said light-light emitting layer.

In a preferable aspect of the light emitter, said single-crystal substrate comprises a silicon substrate; said intermediate layer comprises $Al_xGa_yN$ (x+y=1, 0<x≦1, and 0≦y<1); and said light-emitting layer comprises $In_zAl_xGa_yN$ (x+y+z=1, 0≦x≦1, 0≦y≦1, and 0≦z≦1).

In a preferable aspect, the light emitter is such that it is further equipped with a clad layer, which is formed on said light-emitting layer by means of vapor-phase growth method, and which comprises a nitride semiconductor whose band gap energy is greater than that of said light-emitting layer.

A light-emitting substance, which solves the aforementioned assignment, is one which is characterized in that it completed by being peeled off from a substrate for forming light-emitting layer, the substrate being said substrate of the light emitter; and in that it includes said intermediate layer, said light-emitting layer and said clad layer.

A light emitter, which solves the aforementioned assignment, for forming light-emitting layer is one which is equipped with: a substrate for forming light-emitting layer, the substrate comprising an Si single-crystal substrate; and a light-emitting layer, which is formed on the substrate for forming light-emitting layer by means of vapor-phase growth method, and which comprises a nitride semiconductor; and said substrate for forming light-emitting layer is one which is characterized in that it has a plurality of (n11) Si-plane portions (however, n is an integer of 0-6), (n11) Si-plane portions which are formed by micro fabricating a surface of said single-crystal substrate, and in which an average, of the lengths of maximal-length portions is 1-500 nm, and in that said light-emitting layer is formed on said (n11) Si-plane portions and is constituted of microcrystalgrains whose average grain diameter is 1-500 nm.

In a preferable aspect, the light emitter is such that it is further equipped with an intermediate layer, which is formed on said (n11) Si-plane portions by means of vapor-phase growth method, and which comprises anitride semiconductor including a nucleus substance·that becomes a starting point when said light-emitting layer grows; and the light-emitting layer is formed on the intermediate layer.

In a preferable aspect of the light emitter, said intermediate layer is such that a band gap energy is greater than that of said light-light emitting layer.

In a preferable aspect of the light emitter, said intermediate layer comprises $Al_xGa_yN$ ($x+y=1$, $0<x\leq1$, and $0\leq y<1$); and said light-emitting layer comprises $In_zAl_xGa_yN$ ($x+y+z=1$, $0\leq x\leq1$, $0\leq y\leq1$, and $0\leq z\leq1$).

In a preferable aspect, the light emitter is such that it is further equipped with a clad layer, which is formed on said light-emitting layer by means of vapor-phase growth method, and which comprises a nitride semiconductor whose band gap energy is greater than that of said light-emitting layer.

A light-emitting substance, which solves the aforementioned assignment, is one which is characterized in that it is completed by being peeled off from a substrate for forming light-emitting layer, the substrate being said substrate of the light emitter; and in that it includes said intermediate layer, said light-emitting layer and said clad layer. A light emitter, which solves the aforementioned assignment, is equipped with: a single-crystal substrate; an oriented microcrystal layer, which is formed on the single-crystal substrate; and a light-emitting layer, which is formed on the oriented microcrystal layer by means of vapor-phase growth method, and which comprises a nitride semiconductor; and is one which is characterized in that one of the crystal axes of respective crystals, which constitute said oriented microcrystal layer, is oriented in a specific direction with respect to said single-crystal substrate; and in that an average of the crystal grain diameters of the respective crystals, which constitute said oriented microcrystal layer, is adapted to being 1-1,000 nm; and in that said light-emitting layer is constituted of microcrystal grains whose average grain diameter is 1-1,000 nm, and is formed on the respective crystals, which constitute said oriented microcrystal layer, respectively. In a preferable aspect, the light emitter is further equipped with an intermediate layer, which is formed on said oriented microcrystal layer by means of vapor-phase growth method, and which comprises a nitride semiconductor including a nucleus substance that becomes a starting point when said light-emitting layer grows; and the light-emitting layer is formed on the intermediate layer. In a preferable aspect of the light emitter, said intermediate layer is such that a band gap energy is greater than that of said light-emitting layer. In a preferable aspect of the light emitter, said single-crystal substrate comprises a silicon substrate; said intermediate layer comprises $Al_xGa_yN$ ($x+y=1$, $0<x\leq1$, and $0\leq y<1$); and said light-emitting layer comprises $In_zAl_xGa_yN$ ($x+y+z=1$, $0\leq x\leq1$, $0\leq y\leq1$, and $0\leq z\leq1$). In a preferable aspect, the light emitter is further equipped with a clad layer, which is formed on said light-emitting layer by means of vapor-phase growth method, and which comprises a nitride semiconductor whose band gap energy is greater than that of said light-emitting layer. A light-emitting substance, which solves the aforementioned assignment, is one which is characterized in that it is completed by being peeled off from a substrate for forming light-emitting layer, the substrate being said substrate of the light emitter; and in that it includes said intermediate layer, said light-emitting layer and said clad layer.

BEST MODE FOR CARRYING OUT THE INVENTION (1) A substrate is one which comprises a single-crystal substrate, and an oriented microcrystal layer being formed on the single-crystal substrate; and in which a light-emitting layer comprising a nitride semiconductor is formed on the oriented microcrystal layer by means of vapor-phase growth method.

As for a material quality of said single-crystal substrate, it is not limited in particular as far as being a stable one upon forming the oriented microcrystal layer, an intermediate layer and the light-emitting layer. Although it is possible to employ Si, MgO, $Al_2O_3$, SiC, GaAs or Ge, for instance, it is preferable to adapt it to being Si. When it is a single-crystal substrate comprising Si, it is possible to procure a large-area base plate less expensively and readily, and moreover it is possible to peel off the light-emitting layer, and the like, which is formed on the substrate, readily because the chemical processing is easy. Moreover, as for a structure of the single-crystal substrate, it can be adapted to being a single-layered structure comprising a single material quality, or can be adapted to being a multi-layered structure comprising a plurality of material-quality species.

The shape and size of said single-crystal substrate are not limited in particular, and accordingly it is feasible to set them up properly.

As for a type of said oriented microcrystal layer, it is not limited in particular as far as being one whose size can be controlled readily and which exhibits stability under growth conditions, and it is possible to employ ZnO, Si, $SiO_2$, $SiN_x$ or InAlGaN, and the like, suitably.

Moreover, it is preferable to adapt a thickness of said oriented microcrystal layer to being 5-1,000 nm. When the thickness of the oriented microcrystal layer is less than 5 nm, it does not become possible to demonstrate effects, which result from forming the oriented microcrystal layer, sufficiently. On the other hand, when the thickness of the oriented microcrystal layer exceeds 1,000 nm, the orientation onto the single-crystal substrate becomes difficult. From such viewpoints, it is more preferable to adapt the thickness of the oriented microcrystal layer to being 50-200 nm.

Moreover, respective crystals, which constitute said oriented microcrystal layer, are such that it is preferable that the crystal grain diameters can be uniform as much as possible, that is, the distribution of the crystal grain diameters can be small as much as possible. When the crystal grain diameters in the oriented microcrystal layer are uniform, it becomes advantageous for uniformly microcrystallizing the intermediate layer and light-emitting layer, which are formed on this, in themselves.

As for a forming method of this oriented microcrystal layer, it is not limited in particular, and accordingly it is feasible to employ various methods, which are suitable for the types of the oriented microcrystal layer. For example, when employing ZnO or Si as the oriented microcrystal layer, it is possible to form the oriented microcrystal layer with a predetermined thickness by means of performing a polycrystal-layer forming step in which a polycrystal layer with a predetermined thickness is formed on said single-crystal substrate by means of such a process as sputtering or CVD methods and thereafter by means of performing a surface-modification treating step in which the polycrystal layer is subjected to a surface-modifying treatment to turn it into said oriented microcrystal layer. In this surface-modification treating step, it is possible to carry out an annealing treatment under such an atmospheric condition as vacuum, air or inter gas, and the like, such a temperature condition as 300-1,200° C. approximately, and such a temporal condition as 5-120 minutes approximately. Moreover, when employing $SiO_2$ as the oriented microcrystal layer, it is possible to form the oriented microcrystal layer with a predetermined thickness on an Si base plate by conducting a thermally-oxidizing treatment with respect to an Si single-crystal base plate under such an atmospheric condition as an oxygen-containing atmosphere like air, and so forth, such a temperature condition as 1,000° C. approximately, and such a temporal condition as $10^2$-$10^5$ seconds approximately. When employing $SiN_x$ as the oriented microcrystal layer, it is possible to form the oriented microcrystal layer with a predetermined thickness on an Si base plate by conducting a thermally-nitriding treatment with respect to an Si single-crystal base plate under such an atmospheric condition as $N_2$ br $NH_3$, such a temperature condition as 1,000° C. approximately, and such a temporal condition as $10^2$-$10^5$ seconds approximately. When employing InAlGaN as the oriented microcrystal layer, it is possible to form the oriented microcrystal layer with a predetermined thickness on the single-crystal substrate by means of a known synthesizing method, such as CVD apparatus, MBE apparatus, and so on.

And, in this oriented microcrystal layer, one of the crystal axes of 5-9 out of ten of respective crystals, which constitute the oriented microcrystal layer, is oriented in a specific direction with respect to said single-crystal substrate, and an average of the crystal grain diameters of the respective crystals, which constitute the oriented microcrystal layer, is adapted to being 1-1,000 nm.

Here, "being oriented in a specific direction with respect to the single-crystal substrate" means that one of the crystal axes of the respective crystals, which constitute the oriented microcrystal layer, is oriented with respect to one of the crystal axes in a single crystal, which constitutes the single-crystal substrate. However, it is not a purport to the effect that one of the crystal axes of all of the crystals, which constitute the oriented microcrystal layer, is required to be oriented with respect in a specific direction with respect to the single-crystal substrate.

In said oriented microcrystal layer, it is preferable that, of the crystals, which constitute the oriented microcrystal layer, one of the crystal axes of 8-9 approximately out of ten of the crystals can be oriented in a specific direction with respect to the single-crystal substrate. In the oriented microcrystal layer, when the proportion of the crystals, which orient in a specific direction with respect to the single-crystal substrate, becomes low, because of the fact that the growth density of the oriented microcrystal layer degrades so that the nuclei, which become the starting point of crystal growth, decrease, the raw-material concentration onto one nucleus occurs so that the growth rate of crystal has increased rapidly; as a result, it becomes difficult to intend the microcrystallization of the intermediate layer and light-emitting layer, which are formed on the oriented microcrystal layer. On the other hand, in the oriented microcrystal layer, when the proportion of the crystals, which orient in a specific direction with respect to the single-crystal substrate, exceeds 9 approximately out of ten of them, it becomes impossible or them to grow as microcrystals because it becomes a single-crystal film.

Those whose average of the crystal grain diameters of the respective crystals, which constitute said oriented microcrystal layer, is less than nm, are such that the forming as such is difficult at present. Moreover, when the crystal grain diameters of the oriented microcrystal layer are small, although the crystal grain diameters of the intermediate layer and light-emitting layer, which are formed on this oriented microcrystal layer, become small as being accompanied therewith; when the crystal grain diameters of the microcrystals, which constitute the light-emitting layer, are too small, there is a fear that no desirable light-emitting quantity might become obtainable because of the volumetric lack of light-emitting layer. On the other hand, when the average of the crystal grain diameters of the respective crystals, which constitute the oriented microcrystal layer, exceeds 1,000 nm, it becomes difficult to intend the microcrystallization in the intermediate layer and light-emitting layer, which are formed on this oriented microcrystal layer. From such viewpoints, it is preferable that the average of the crystal grain diameters in the oriented microcrystal layer can be 5-500 nm, and being 5-200 nm is more preferable.

Here, when the average of the crystal grain diameters of the respective crystals, which constitute the oriented microcrystal layer, is 1-1,000 nm, an average of the crystal grain diameters of respective crystals, which constitute the light-emitting layer being formed on this oriented microcrystal layer by way of said intermediate layer or being formed directly thereon, can be adapted to being 1-1,000 nm approximately; when the average of the crystal grain diameters of the respective crystals, which constitute the oriented microcrystal layer, is 5-500 nm, it can be adapted to being 5-500 nm approximately; and when the average of the crystal grain diameters of the respective crystals, which constitute the oriented microcrystal layer, is 5-200 nm, it can be adapted to being 5-200 nm approximately.

Thus, in accordance with the substrate, which has the specific oriented microcrystal layer, for forming light-emitting layer, it is possible to effectively microcrystallize the light-emitting layer, which is formed on the oriented microcrystal layer by means of vapor-phase growth method. It is believed that the light-emitting layer is microcrystallized like this because the light-emitting layer is microcrystallized following the crystal size of the oriented microcrystal layer being a foundation layer.

The light emitter is one which is equipped with the following: the substrate for forming light-emitting layer; an intermediate layer, which is formed on said oriented microcrystal layer of the substrate for forming light-emitting layer by means of vapor-phase growth method, and which comprises a nitride semiconductor, if necessary; a light-emitting layer, which is formed on the intermediate layer by means of vapor-phase growth method when the intermediate layer is formed, or which is formed by means of vapor-phase growth method on said oriented microcrystal layer when the intermediate layer is not formed, and which comprises a nitride semiconductor; and a clad layer, which is formed on the light-emitting layer by means of vapor-phase growth method, and which comprises a nitride semiconductor, if necessary.

This light emitter can be formed by means of performing the following: an intermediate-layer forming step of forming an intermediate layer comprising a nitride semiconductor on said oriented microcrystal layer of the substrate, for forming light-emitting layer by means of vapor-phase growth method, if necessary; a light-emitting-layer forming step of forming a light-emitting layer comprising a nitride semiconductor on the intermediate layer when the intermediate layer is formed, or on said oriented microcrystal layer when the intermediate layer is not formed, by means of vapor-phase growth method; and a clad-layer forming step of forming a clad layer comprising a nitride semiconductor on the light-emitting layer by means of vapor-phase growth method, if necessary.

Said intermediate layer is one which comprises a nitride semiconductor including a nucleus substance that becomes a starting point when the light-emitting layer grows. Accordingly, when it is difficult to grow the light-emitting layer on the oriented microcrystal layer, it is preferable that an intermediate layer can be first formed on the oriented microcrystal layer and then the light-emitting layer can be formed on this intermediate layer. On the other hand, when it is possible to readily form the light-emitting layer on the oriented microcrystal layer, it is allowable to form the light-emitting layer directly on the oriented microcrystal layer without ever forming any intermediate layer. However, even when it is possible to readily form the light-emitting layer on the oriented microcrystal layer, it is natural that it is allowable as well to first form an intermediate layer on the oriented microcrystal layer and then form the light-emitting layer on this intermediate layer.

Said intermediate layer is such that it is preferable that it can be one whose band gap energy is greater than that of said light-emitting layer. By the fact that the light-emitting layer is formed on an intermediate layer whose band gap energy is greater than that of the light-emitting layer so that it is put into a laminated state, it is possible to avoid the movement of electrons from the light-emitting layer to the intermediate layer. Thus, it turns into a light emitter which exhibits the quantum containment effect, and thereby it becomes feasible to effectively improve the light-emitting efficiency. Moreover, an intermediate layer whose band gap energy is greater than that of the light-emitting layer is generally such that the refractive index becomes smaller than that of the light-emitting layer. Accordingly, by the fact that the light-emitting layer is formed on an intermediate layer whose refractive index is smaller than that of the light-emitting layer so that it is put into a laminated state, it is possible to avoid the movement of light from the light-emitting layer to the intermediate layer. Thus, it is possible to make light, which is emitted at the light-emitting layer, stay within the light-emitting layer for a much longer period of time, and thereby it becomes feasible to intend to make the light-emitting longevity longer.

It is preferable that a thickness of said intermediate layer can be adapted to being 5-500 nm. When considering said containment effect, if the intermediate layer is too thin, said containment effect cannot be obtained sufficiently. On the other hand, when the thickness of the intermediate layer is too thick, the microcrystallization of the light-emitting layer becomes difficult. From such viewpoints, it is more preferable that the thickness of the intermediate layer can be adapted to being 10-100 nm.

Said light-emitting layer is one which is constituted of microcrystal grains whose average grain diameter is 1-1,000 nm. The light-emitting layer, which is constituted of such microcrystal grains, is formed on the substrate for forming light-emitting layer in such a form that the respective light-emitting layers are distributed in a dotted shape independently. Note that it is allowable as well that it can be formed on the substrate for forming light-emitting layer in such a form that parts of the light-emitting layers neighbor on each other.

Those whose average grain diameter of the microcrystal grains, which constitute the light-emitting layer, is less than 1 nm, are such that the forming as such is difficult at present. Moreover, when the average crystal grain diameter of the microcrystal grains, which constitute the light-emitting layer, is too small, there is a fear that no desirable light-emitting quantity might become obtainable because of the volumetric lack of light-emitting layer. On the other hand, when the average crystal grain diameter of the microcrystal grains, which constitute the light-emitting layer, exceeds 1,000 nm, it becomes impossible to effectively improve the light-emitting efficiency of the light-emitting layer. From such viewpoints, it is preferable that the average crystal grain diameter of the microcrystal grains, which constitute the light-emitting layer, can be 5-500 nm, and being 5-200 nm is more preferable.

Thus, in the light emitter, since the light-emitting layer is constituted of the microcrystal grains, it becomes feasible to effectively improve the light-emitting efficiency by means of the mircrocrystallization of light-emitting layer. Moreover, since this light-emitting layer is formed by means of vapor-phase growth method, there is no such a problem that it is blackened due to nitrogen deficiency so that the crystal quality degrades. Further, in accordance with vapor-phase growth method, since the control of raw-material supply is easy, the control of making mixed crystal and the concentration control of impurities become feasible, and thereby the improvement of color rendering property or light-emitting efficiency becomes feasible.

In the light emitter, although a type of said single-crystal substrate and the compositions of said intermediate layer and light-emitting layer are not limited in particular as far as each of them is one which is capable of achieving their predetermined functions; and although it is feasible to employ various combinations; as an example of the preferable aspects, it is possible to name one in which: said single-crystal substrate comprises a silicon substrate; said intermediate layer comprises $Al_xGa_yN$ ($x+y=1$, $0<x\leq1$, and $0\leq y<1$); and said light-emitting layer comprises $In_zAl_xGa_yN$ ($x+y+z=1$, $0\leq x\leq1$, $0\leq y\leq1$, and $0\leq z\leq1$). The composition ratios in this light-emitting layer can be set up variously depending on required light-emitting wavelengths. Moreover, although the composition ratios in the intermediate layer can be set up variously so as to include a nucleus substance that becomes a starting point when the light-emitting layer, which is formed on the intermediate layer, grows, it is preferable to set them up so as to make the band gap energy greater than that of the light-emitting layer.

Moreover, in the light emitter, it is preferable that said light-emitting layer can include a proper (proper for improving the light-emitting intensity, for instance) impurity. For example, the light-emitting layer, which includes a donor impurity, such as Si, or C, and an acceptor impurity, such as Zn, Mg or C, is preferable, because it is possible to obtain the light emitting of donor-acceptor pair. In accordance with the light-emitting layer which includes both of such donor impurity and acceptor impurity, it becomes feasible to remarkably increase the light-emitting intensity, and additionally it becomes feasible to obtain broad light-emitting wavelengths. Note that, when an impurity concentration in the light-emitting layer is too low, the probability of light emitting at donor-acceptor pair degrades. On the other hand, when an impurity concentration in the light-emitting layer is too high, defects occur in the crystals of the light-emitting layer so that non-light-emitting centers generate; as a result, the light-emitting intensity degrades. Accordingly, it is preferable that both of the donor impurity and acceptor impurity can be included in predetermined concentrations, respectively, in the respective microcrystal grains, which constitute said light-emitting layer. Note that the optimum concentration range of the impurities in the light-emitting layer fluctuates depending on the composition ratios of the light-emitting layer as parent material.

Further, the light emitter can preferably be further equipped with a clad layer, which is formed on said light-emitting layer by means of vapor-phase growth method, and which comprises a nitride semiconductor whose band gap energy is greater than that of the light-emitting layer. By the fact that a clad layer whose band gap energy is greater than that of the light-emitting layer is formed on the light-emitting layer so that it is put into a laminated state, it is possible to avoid the movement of electrons from the light-emitting layer to the clad layer. Thus, it turns into a light emitter which exhibits the quantum containment effect, and thereby it becomes feasible to effectively improve the light-emitting efficiency. Moreover, a clad layer whose band-gap energy is greater than that of the light-emitting layer is generally such that the refractive index becomes smaller than that of the light-emitting layer. Accordingly, by the fact that a clad layer whose refractive index is smaller than that of the light-emitting layer is formed on the light-emitting layer so that it is put into a laminated state, it is possible to avoid the movement of light from the light-emitting layer to the clad layer. Thus, it is possible to make light, which is emitted at the light-emitting layer, stay within the light-emitting layer for a much longer period of time, and thereby it becomes feasible to intend to make the light-emitting longevity longer. In addition, when said intermediate layer is formed on the oriented microcrystal layer of the substrate for forming light-emitting layer, since it is put into such a laminated state that the light-emitting layer is held between the intermediate layer, whose band gap energy is greater and refractive index is smaller than those of the light-emitting layer, and clad layer, whose band gap energy is greater and refractive index is smaller than those of the light-emitting layer, it becomes possible to more effectively make electrons and light stay within the light-emitting layer, and thereby it becomes feasible to more effectively accomplish the improvement of light-emitting efficiency and making the longevity of light emitting longer.

It is preferable that a thickness of said clad layer can be adapted to being 5-500 nm. When considering said containment effect, if the clad layer is too thin, said containment effect cannot be obtained sufficiently. On the other hand, when the thickness of the clad layer is too thick, the transmissivity of electron beam in the clad layer degrades. From such viewpoints, it is more preferable that the clad layer can be adapted to being 10-100 nm.

Moreover, it is preferable that this clad layer can be formed so as to completely cover said light-emitting layer. By doing thusly, it is possible to securely protect the light-emitting layer by means of the clad layer.

As described above, said intermediate layer, said light-emitting layer, and said clad layer are such that all of them are formed by means of vapor-phase growth method. Although the conditions and the like of this vapor-phase growth method are not limited in particular, it is possible to suitably use a metalorganic gas-phase growth method (or MOCVD method) which uses a predetermined organic metal as a raw material.

A light-emitting substance is one which is characterized in that it is completed by being peeled off from a substrate for forming light-emitting layer, the substrate being said substrate of the light emitter; and in that it includes said intermediate layer, said light-emitting layer and said clad layer. This light-emitting substance is put into such a laminated state that the light-emitting layer is held between the intermediate layer, whose band gap energy is greater than that of the light-emitting layer and whose refractive index is smaller than that of the light-emitting layer, and clad layer, whose band gap energy is greater than that of the light-emitting layer and whose refractive index is smaller than that of the light-emitting layer. Accordingly, in accordance with this light-emitting substance, it is possible to make electrons and light stay within the light-emitting layer more effectively, and thereby it becomes feasible to more effectively achieve improving the light-emitting efficiency and making the light-emitting longevity longer.

As for a method of peeling off the light-emitting substance, which includes said intermediate layer, said light-emitting layer and said clad layer, from the substrate for forming light-emitting layer, although it is not limited in particular, it is possible to utilize wet etching or dry etching, for instance.

Thus, the light emitter being provided with the light-emitting layer comprising the microcrystal grains, or the light-emitting substance in which the light-emitting layer comprising the microcrystal grains is held between the intermediate layer and the clad layer, can be utilized for plasma display or fluorescent light, and the like, as fluorescent material that emits light by means of electron beam or ultraviolet excitation. Moreover, since the light-emitting substance, is not formed on an Si base plate, and so forth, which absorbs visible light to degrade the light-emitting efficiency, an application as fluorescent material that emits light by means of visible light is feasible.

(2) A substrate for forming light-emitting layer in a light emitter is one which comprises an Si single-crystal substrate, and in which a light-emitting layer comprising a nitride semiconductor is formed on the single-crystal substrate by means of vapor-phase growth method.

Said single-crystal substrate is one which comprises Si. The shape and size of this single-crystal substrate are not limited in particular, and accordingly it is feasible to set them up properly.

And, this substrate for forming light-emitting layer has a plurality of (n11) Si-plane portions (however, n is an integer of 0-6), (n11) Si-plane portions which are formed by micro fabricating a surface of the single-crystal substrate, and in which an average of the lengths of maximal-length portions is 1-500 nm.

Said (n11) Si-plane portions are those whose n is 0, 1, 2, 3, 4, 5 or 6, that is, they are a (011) Si-plane portion, a (111) Si-plane portion, a (211) Si-plane portion, a (311) Si-plane portion, a (411) Si-plane portion, a (511) Si-plane portion, and a (611) Si-plane portion.

A size of said (n11) Si-plane portions is such that an average of the lengths of maximal-length portions is adapted to being 1-500 nm. When the average of the lengths of maximal-length portions of the (n11) Si-plane portions becomes less than 1 nm, forming an intermediate layer or light-emitting layer on the (n11) Si-plane portions as such becomes difficult. On the other hand, when the average of the lengths of maximal-length portions of the (n11) Si-plane portions exceeds 1,000 run, it becomes difficult to intend the microcrystallization in an intermediate layer and light-emitting layer, which are formed on these (n11) Si-plane portions. From such viewpoints, it is preferable that the average of the lengths of maximal-length portions of the (n11) Si-plane portions can be 5-500 nm, and being 5-200 nm is more preferable.

Here, when the average of the lengths of maximal-length portions of the (n11) Si-plane portions is 5-500 nm, an average of the crystal grain diameters of respective crystals, which constitute a light-emitting layer being formed on these (n11) Si-planes by way of said intermediate layer or directly thereon, can be adapted to being 5-500 nm approximately; and, when the average of the lengths of maximal-length portions of the (n11) Si-plane portions is 5-200 nm, it can be adapted to being 5-200 nm approximately.

Thus, in accordance with the substrate having the specific (n11) Si-plane portions, for forming light-emitting layer, it is possible to effectively microcrystallize the light-emitting layer, which is formed on the (n11) Si-plane portions by means of vapor-phase growth method. The fact that the light-emitting layer is microcrystallized like this is believed that, since crystals grow on the (n11) Si-plane portions alone, the sizes of these crystals are determined by the sizes of the (n11) Si-plane portions.

Moreover, it is preferable that the sizes of the (n11) Si-plane portions can be uniform as much as possible. When the sizes of the respective (n11) Si-plane portions are uniform, it becomes advantageous to uniformly microcrystallize them in the intermediate layer and light-emitting layer, which are formed on these respective (n11) Si-plane portions.

As for a forming method of these (n11) Si-plane portions, it is not limited in particular. However, in order to form said (n11) Si-plane portions by micro fabricating a surface of the Si substrate, it is necessary to micro fabricate Si planes other than the (111) Si plane. For example, it is possible to form said (n11) Si-plane portions by carrying out anisotropy etching the (001) Si plane and (011) Si plane using an anisotropy etching solution, such as KOH (potassium hydroxide) or TMAH (tetramethylammonium hydroxide $(CH_3)_4NOH$), and the like, or by conducting mechanical fabricating to them. Note that, when forming the (n11) Si-plane portions by means of anisotropy etching, it is possible to control the sizes of the (n11) Si-plane portions by adjusting the immersion time in the anisotropy etching solution, or the temperature or concentration and the like of the anisotropy etching solution.

The light emitter, is one which is equipped with the following: said substrate for forming light-emitting layer; an intermediate layer, which is formed on said (n11) Si-plane portions of the substrate for forming light-emitting layer by means of vapor-phase growth method, and which comprises a nitride semiconductor I if necessary; a light-emitting layer, which is formed on the intermediate layer by means of vapor-phase growth method when the intermediate layer is formed, or on said (n11) Si-plane portions by means of vapor-phase growth method when the intermediate layer is not formed, and which comprises a nitride semiconductor; and a clad layer, which is formed on the light-emitting layer by means of vapor-phase growth method, and which comprises a nitride semiconductor, if necessary.

This light emitter can be formed by means of performing the following: an intermediate-layer forming step of forming an intermediate layer comprising a nitride semiconductor on said (n11) Si-plane portions of said substrate for forming light-emitting layer by means of vapor-phase growth method, if necessary; a light-emitting-layer forming step of forming a light-emitting layer comprising a nitride semiconductor on the intermediate layer when the intermediate layer is formed, or on said (n11) Si-plane portions when the intermediate layer is not formed, by means of vapor-phase growth method; and a clad-layer forming step of forming a clad layer comprising a nitride semiconductor on the light-emitting layer by means of vapor-phase growth method, if necessary.

Said intermediate layer is one which comprises a nitride semiconductor including a nucleus substance that becomes a starting point when the light-emitting layer grows. Accordingly, when it is difficult to grow the light-emitting layer on the (n11) Si-plane portions, it is preferable that an intermediate layer can be first formed on the (n11) Si-plane portions and then the light-emitting layer can be formed on this intermediate layer. On the other hand, when it is possible to readily form the light-emitting layer on the (n11) Si-plane portions, it is allowable to form the light-emitting layer directly on these (n11) Si-plane-portions without ever forming any intermediate layer. However, even when it is possible to readily form the light-emitting layer on the (n11) Si-plane portions, it is natural that it is allowable as well to first form an intermediate layer on the (n11) Si-plane portions and then form the light-emitting layer on this intermediate layer. Note that, when forming a light-emitting layer including Ga directly on the (n11) Si-plane portions, Si is corroded by means of the fact that Si and Ga react at high temperature, and thereby holes on the order of micron have been formed. Accordingly, when forming a light-emitting layer including Ga, it is preferable to first form an intermediate layer on the (n11) Si-plane portions and then form the light-emitting layer on this intermediate layer.

Said intermediate layer is such that it is preferable that it can be one whose band gap energy is greater than that of said light-emitting layer. By the fact that the light-emitting layer is formed on an intermediate layer whose band gap energy is greater than that of the light-emitting layer so that it is put into a laminated state, it is possible to avoid the movement of electrons from the light-emitting layer to the intermediate layer. Thus, it turns into a light emitter which exhibits the quantum containment effect, and thereby it becomes feasible to effectively improve the light-emitting efficiency. Moreover, an intermediate layer whose band gap energy is greater than that of the light-emitting layer is generally such that the refractive index becomes smaller than that of the light-emitting layer. Accordingly, by the fact that the light-emitting layer is formed on an intermediate layer whose refractive index is smaller than that of the light-emitting layer so that it is put into a laminated state, it is possible to avoid the movement of light from the light-emitting layer to the intermediate layer. Thus, it is possible to make light, which is emitted at the light-emitting layer, stay within the light-emitting layer for a much longer period of time, and thereby it becomes feasible to intend to make the light-emitting longevity longer.

It is preferable that a thickness of said intermediate layer can be adapted to being 5-500 nm. When considering said containment effect, if the intermediate layer is too thin, said containment effect cannot be obtained sufficiently. On the other hand, when the thickness of the intermediate layer is too thick, the microcrystallization of the light-emitting layer becomes difficult. From such viewpoints, it is more preferable that the thickness of the intermediate layer can be adapted to being 10-100 nm.

Said light-emitting layer is one which is constituted of microcrystal grains whose average grain diameter is 1-1,000 nm. The light-emitting layer, which is constituted of such microcrystal grains, is formed on the substrate for forming light-emitting layer in such a form that the respective light-emitting layers are distributed in a dotted shape independently. Note that it is allowable as well that it can be formed on the substrate for forming light-emitting layer in such a form that parts of the light-emitting layers neighbor on each other.

Those whose average grain diameter of the microcrystal grains, which constitute the light-emitting layer, is less than 1 nm, are such that the forming as such is difficult at present. Moreover, when the average crystal grain diameter of the microcrystal grains, which constitute the light-emitting layer, is too small, there is a fear that no desirable light-emitting quantity might become obtainable because of the volumetric lack of light-emitting layer. On the other hand, when the average crystal grain diameter of the microcrystal grains, which constitute the light-emitting layer, exceeds 1,000 nm, it becomes impossible to effectively improve the light-emitting efficiency of the light-emitting layer. From such viewpoints, it is preferable that the average crystal grain diameter of the microcrystal grains, which constitute the light-emitting layer, can be 5-500 nm, and being 5-200 nm is more preferable.

Thus, in the light emitter, since the light-emitting layer is constituted of the microcrystal grains, it becomes feasible to effectively improve the light-emitting efficiency by means of the mircrocrystallization of light-emitting layer. Moreover, since this light-emitting layer is formed by means of vapor-phase growth method, there is no such a problem that it is blackened due to nitrogen deficiency so that the crystal quality degrades. Further, in accordance with vapor-phase growth method, since the control of raw-material supply is easy, the control of making mixed crystal and the concentration control of impurities become feasible, and thereby the improvement of color rendering property or light-emitting efficiency becomes feasible.

In the light emitter, although a type of said single-crystal substrate and the compositions of said intermediate layer and light-emitting layer are not limited in particular as far as each of them is one which is capable of achieving their predetermined functions; and although it is feasible to employ various combinations; as an example of the preferable aspects, it is possible to name one in which: said single-crystal substrate comprises a silicon substrate; said intermediate layer comprises $Al_xGa_yN$ ($x+y=1$, $0 \leqq x \leqq 1$, and $0 \leqq y<1$); and said light-emitting layer comprises $In_zAl_xGa_yN$ ($x+y+Z=1$, $0 \leqq 1$, $0 \leqq y \leqq 1$, and $0 \leqq z \leqq 1$). The composition ratios in this light-emitting layer can be set up variously depending on required light-emitting wavelengths. Moreover, although the composition ratios in the intermediate layer can be set up variously so as to include a nucleus substance that becomes a starting point when the light-emitting layer, which is formed on the intermediate layer, grows, it is preferable to set them up so as to make the band gap energy greater than that of the light-emitting layer.

Moreover, in the light emitter, it is preferable that said light-emitting layer can include a proper (proper for improving the light-emitting intensity, for instance) impurity. For example, the light-emitting layer, which includes a donor impurity, such as Si, or C, and an acceptor impurity, such as Zn, Mg or C, is preferable, because it is possible to obtain the light emitting of donor-accept or pair. In accordance with the light-emitting layer which includes both of such donor impurity and acceptor impurity, it becomes feasible to remarkably increase the light-emitting intensity, and additionally it becomes feasible to obtain broad light-emitting wavelengths. Note that, when an impurity concentration in the light-emitting layer is too low, the probability of light emitting at donor-acceptor pair degrades. On the other hand, when an impurity concentration in the light-emitting layer is too high, defects occur in the crystals of the light-emitting layer so that non-light-emitting centers generate; as a result, the light-emitting intensity degrades. Accordingly, it is preferable that both of the donor impurity and acceptor impurity can be included in predetermined concentrations, respectively, in the respective microcrystal grains, which constitute said light-emitting layer. Note that the optimum concentration range of the impurities in the light-emitting layer fluctuates depending on the composition ratios of the light-emitting layer as parent material.

Further, the light emitter can preferably be further equipped with a clad layer, which is formed on said light-emitting layer by means of vapor-phase growth method, and which comprises a nitride semiconductor whose band-gap energy is greater than that of the light-emitting layer. By the fact that a clad layer whose band gap energy is greater than that of the light-emitting layer is formed on the light-emitting layer so that it is put into a laminated state, it is possible to avoid the movement of electrons from the light-emitting layer to the clad layer. Thus, it turns into a light emitter which exhibits the quantum containment effect, and thereby it becomes feasible to effectively improve the light-emitting efficiency. Moreover, a clad layer whose band gap energy is greater than that of the light-emitting layer is generally such that the refractive index becomes smaller than that of the light-emitting layer. Accordingly, by the fact that a clad layer whose refractive index is smaller than that of the light-emitting layer is formed on the light-emitting layer so that it is put into a laminated state, it is possible to avoid the movement of light from the light-emitting layer to the clad layer. Thus, it is possible to make light, which is emitted at the light-emitting layer, stay within the light-emitting layer for a much longer period of time, and thereby it becomes feasible to intend to make the light-emitting longevity longer. In addition, when said intermediate layer is formed on the (n11) Si-plane portions of the substrate for forming light-emitting layer, since it is put into such a laminated state that the light-emitting layer is held between the intermediate layer, whose band gap energy is greater and refractive index is smaller than those of the light-emitting layer, and clad layer whose band gap energy is greater and refractive index is smaller than those of the light-emitting layer, it becomes possible to more effectively make electrons and light stay within the light-emitting layer, and thereby it becomes feasible to more effectively accomplish the improvement of light-emitting efficiency and making the longevity of light emitting longer.

It is preferable that a thickness of said clad layer can be adapted to being 5-500 nm. When considering said containment effect, if the clad layer is too thin, said containment effect cannot be obtained sufficiently. On the other hand, when the thickness of the clad layer is too thick, the transmissivity of electron beam in the clad layer degrades. From such viewpoints, it is more preferable that the clad layer can be adapted to being 10-100 nm.

Moreover, it is preferable that this clad layer can be formed so as to completely cover said light-emitting layer. By doing thusly, it is possible to securely protect the light-emitting layer by means of the clad layer.

As described above, said intermediate layer, said light-emitting layer, and said clad layer are such that all of them are formed by means of vapor-phase growth method. Although the conditions and the like of this vapor-phase growth method are not limited in particular, it is possible to suitably utilize a metal organic gas-phase growth method (or MOCVD method or MOVPE method) which uses a predetermined organic metal as a raw material.

A light-emitting substance is one which is characterized in that it is completed by being peeled off from a substrate for forming light-emitting layer, the substrate being said substrate of the light emitter; and in that it includes said intermediate layer, said light-emitting layer and said clad layer. This light-emitting substance is put into such a laminated state that the light-emitting layer is held between the intermediate layer, whose band-gap energy is greater and refractive index is smaller than those of the light-emitting layer, and clad layer, whose band gap energy is greater than that of the light-emitting layer and whose refractive index is smaller than that of the light-emitting layer. Accordingly, in accordance with this light-emitting substance, it is possible to make electrons and light stay within the light-emitting layer more effectively, and thereby it becomes feasible to more effectively achieve improving the light-emitting efficiency and making the light-emitting longevity longer.

As for a method of peeling off the light-emitting substance, which includes said intermediate layer, said light-emitting layer and said clad layer, from the substrate for forming light-emitting layer, although it is not limited in particular, it is possible to utilize wet etching or dry etching, for instance.

Thus, the light emitter being provided with the light-emitting layer comprising the microcrystal grains, or the light-emitting substance in which the light-emitting layer comprising the microcrystal grains is held between the intermediate layer and the clad layer, can be utilized for plasma display or fluorescent light, and the like, as fluorescent material that emits light by means of electron beam or ultraviolet excitation. Moreover, since the light-emitting substance is not formed on an Si base plate, and so forth, which absorbs visible light to degrade the light-emitting efficiency, an application as fluorescent material that emits light by means of visible light is feasible.

(3) A light emitter is equipped with the following: a•single-crystal substrate; an oriented microcrystal layer, which is formed on the single-crystal substrate; an intermediate layer, which is formed on the oriented microcrystal layer by means of vapor-phase growth method, and which comprises a nitride semiconductor, if necessary; a light-emitting layer, which is formed on the intermediate layer by means of vapor-phase growth method when the•intermediate layer is formed, or which is formed on the oriented microcrystal layer by means of vapor-phase growth method when the intermediate layer is not formed, and which comprises a nitride semiconductor; and a clad layer, which is formed on the light-emitting layer by means of vapor-phase' growth method, and which comprises a nitride semiconductor, if necessary. As for said single-crystal substrate, it is possible to adapt it to being the same constitution as that of the single-crystal substrate in the substrate for forming light-emitting layer. And, in the light emitter one of the crystal axes of respective crystals, which constitute said oriented microcrystal layer, is oriented in a specific direction with respect to said single-crystal substrate; and an average of the crystal grain diameters of the respective crystals, which constitute said oriented microcrystal layer, is adapted to being 1-1,000 nm. Specifically, in the oriented" microcrystal layer in the substrate, which is directed to the present invention, for forming light-emitting layer, one of the crystal axes of 5-9 out of ten of the crystals which constitute the oriented microcrystal layer, is oriented in a specific direction with respect to said single-crystal substrate; on the contrary, in the oriented microcrystal layer in the light emitter, one of the crystal axes of the respective crystals, which constitute the oriented microcrystal layer, is oriented in a specific direction with respect to said single-crystal substrate. In the oriented microcrystal layer in the substrate, it is preferable that, of the crystals, which constitute the oriented microcrystal layer, one of the crystal axes of 5-9 approximately (preferably 8-9 approximately out often) out of ten of the crystals can be oriented in a specific direction with respect to the single-crystal substrate. As to those other than such a difference, the oriented microcrystal layer in the light emitter, can be adapted to being the same constitutions as those of the oriented microcrystal layer in the substrate, for forming light-emitting layer. And, in the light emitter, said light-emitting layer is constituted of microcrystal grains whose average grain diameter is 1-1,000 nm, and is formed on the respective crystals, which constitute said oriented microcrystal layer, respectively. Specifically, in the light-emitting layer in the light emitter, it is constituted of the microcrystal grains whose average grain diameter is 1-1,000 nm; on the contrary, in the light-emitting layer in the light emitter, it is constituted of the microcrystal grains whose average grain diameter is 1-1,000 nm, and is formed on the respective crystals, which constitute said oriented microcrystal layer, respectively. As to those other than such a difference, the light-emitting layer in the light emitter can be adapted to being the same constitutions as those of the oriented microcrystallayer in the light emitter. Moreover, regarding the intermediate layer and clad layer in the light emitter, they can be adapted to being the same constitutions as those of the intermediate layer and clad layer in the light emitter. Therefore, in the same manner as the light emitter, when the light emitter, has the intermediate layer and clad layer, it is possible to obtain a light-emitting substance, which is completed by being peeled off from the substrate for forming light-emitting layer in this light emitter, and which includes the intermediate layer, the light-emitting layer and the clad layer. Hereinafter, regarding examples of the present invention, they will be described concretely.

Example No. 1

Example No. 1 is one which has embodied the invention.

Figure 1:
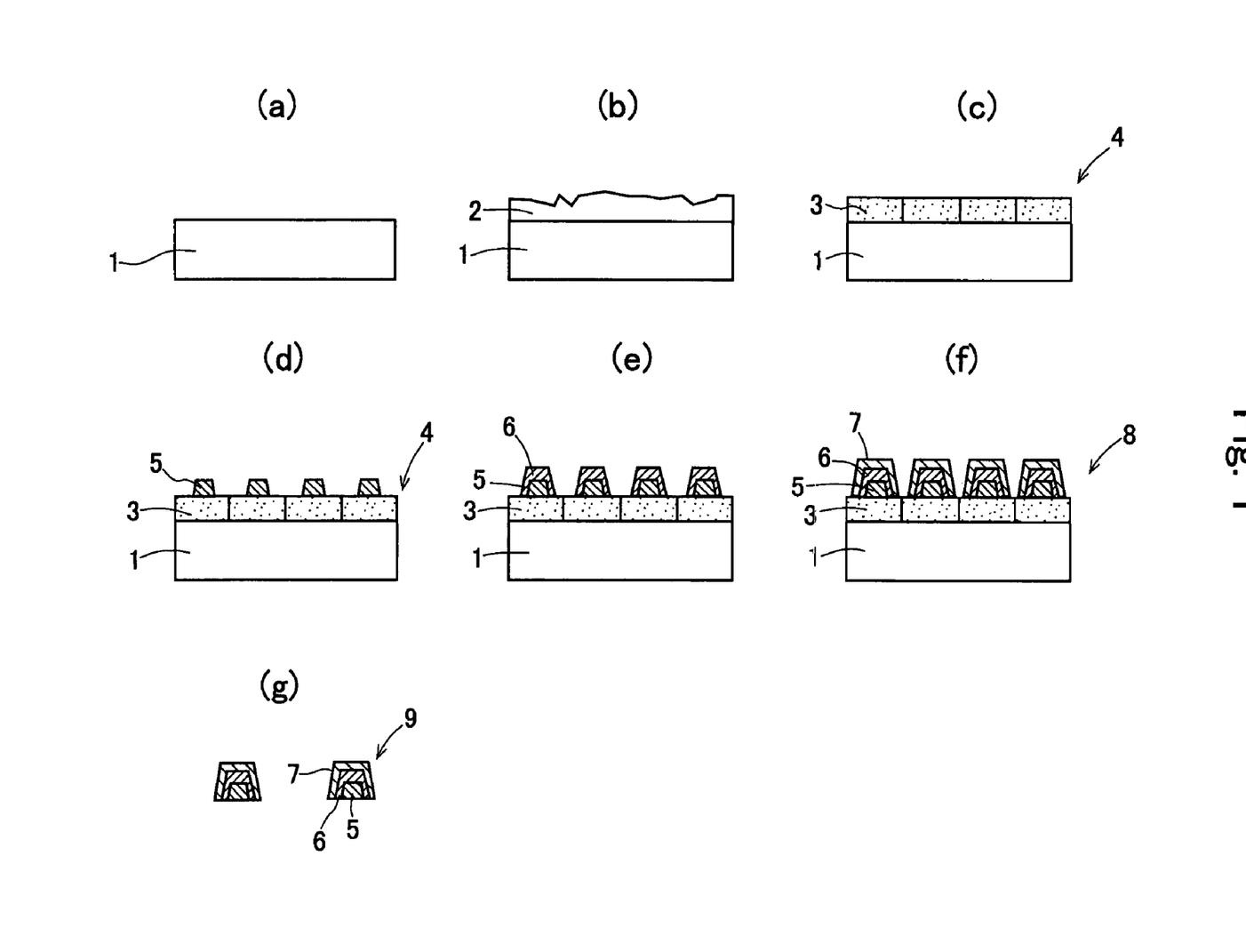
FIG. 1 is directed to Example No. 1 of the present invention, and is cross-sectional views for schematically illustrating production steps of a substrate for forming light-emitting layer, a light emitter and a light-emitting substance.

A substrate 4 for forming light-emitting layer, substrate 4 which is directed to the present example illustrated in the cross-sectional diagram of FIG. 1 (*c*), is constituted of the following: a single-crystal substrate 1 comprising an Si single-crystal base plate; and an oriented microcrystal layer 3 which is formed on this single-crystal substrate 1 and whose thickness is 100 nm approximately.

This oriented microcrystal layer 3 is such that one of the crystal axes of respective crystals, which constitute the oriented microcrystal layer 3, is oriented in a specific direction with respect to the single-crystal substrate 1. Concretely, the c-axis of the respective crystals, which constitute the oriented microcrystal layer 3, is oriented in the perpendicular direction with respect to the single-crystal substrate 1. In the oriented microcrystal layer 3, note that, of the crystals that constitute the oriented microcrystal layer 3, the c-axis of the crystals of 5 or more approximately out of ten is oriented in the perpendicular direction with respect to the single-crystal substrate 1.

Moreover, this oriented microcrystal layer 3 is such that an average of the crystal grain diameters of the respective crystals, which constitute the oriented microcrystal layer 3, is adapted to being 50 nm approximately.

In addition, a light emitter 8, which is directed to the present example illustrated in the schematic cross-sectional diagram of FIG. 1 (f), is constituted of the following: said substrate 4 for forming light-emitting layer; a plurality of intermediate layers 5, which are formed on said oriented microcrystal layer 3 of this substrate 4 for forming light-emitting layer by means of vapor-phase growth method, and which comprise a nitride semiconductor; a plurality of light-emitting layers 6, which are formed on the respective intermediate layers 5 by means of vapor-phase growth method respectively, and which comprise a nitride semiconductor; and a plurality of clad layers 7, which are formed on the respective light-emitting layers 6 by means of vapor-phase growth method respectively, and which comprise a nitride semiconductor.

The intermediate layers 5 are those which have a composition formula, AlN, and which include Al as a nucleus substance that becomes a starting point when the light-emitting layers 6 grow. Moreover, the intermediate layers 5 are such that the band gap energy is adapted to being greater than that of the light-emitting layers 6 and the refractive index is adapted to being smaller than that of the light-emitting layers 6. And, a thickness of these intermediate layers 5 is adapted to be 10 nm approximately.

The light-emitting layers 6 have a composition formula, GaN. The respective light-emitting layers 6 are constituted of single microcrystal grains whose average grain diameter is 150 nm, respectively. Moreover, most of the light-emitting layers 6 are independent of the neighboring light-emitting layers 6 with gaps in between. And, the respective light-emitting layers 6 include Si as a donor impurity in a concentration of $8.0 \times 10^{18}/cm^3$, and includes Zn as an acceptor impurity in a concentration of $4.0 \times 10^{19}/cm^3$.

The clad layers 7 have a composition formula, AlN. Moreover, the clad layers 7 are such that the band-gap energy is adapted to being greater than that of the light-emitting layers 6 and the refractive index is adapted to being smaller than that of the light-emitting layers 6. And, these clad layers 7 are formed in a thickness of 1 nm so as to cover the entirety of the light-emitting layers 6.

Moreover, a light-emitting substance 9, which is directed to the present invention illustrated in the schematic cross-sectional diagram of FIG. 1 (g), is completed by being peeled off from the light-emitting-layer forming substrate 4 of said light emitter 8, and is constituted of said intermediate layer 5, said light-emitting layer 6 and said clad layer 7.

This light-emitting substance 9 is put into such a laminated state that the light-emitting layer 6 is held between the intermediate layer 5, whose band gap energy is greater and refractive index is smaller than those of the light-emitting layer 6, and the clad layer 7, whose band gap energy is greater and refractive index is smaller than those of the light-emitting layer 6. And, an average particle diameter of this light-emitting substance 9 is adapted to being, 100-200 nm.

The substrate 4 for forming light-emitting layer, light emitter 8 and light-emitting substance 9, which are directed to the present example having such constructions, were produced as follows.

<Oriented-Microcrystal-Layer Forming Step>

A single-crystal substrate 1, which comprised an Si single-crystal base plate, was prepared (see FIG. 1 (a)). Note that this single-crystal substrate 1 was one whose (111) Si plane was polished chemically so that a surface roughness, which was expressed by mean square height, was adapted to being 0.1 nm or less.

By means of sputtering ZnO with respect to the (111) Si plane of said single-crystal substrate 1 in an Ar atmosphere of 6 mTorr approximately, a polycrystal layer 2 whose thickness was 100 nm approximately was formed on the single-crystal substrate 1 (a polycrystal-layer forming step, see FIG. 1 (b)).

And, the single-crystal substrate 1 with the polycrystal layer 2 formed was put in a quartz tube, and the polycrystal layer 3 was made into said oriented microcrystal layer 3 by means of conducting an annealing treatment under such conditions as in an $N_2$ atmosphere, and at 800° C. and for 30 minutes (a surface-modification treating step, see FIG. 1 (c)).

Thus, the substrate 4 for forming light-emitting layer was produced, substrate 4 which is directed to the present example comprising the single-crystal substrate 1 and the oriented microcrystal layer 3 being formed on this single-crystal substrate 1.

Next, with respect to the obtained substrate 4 for forming light-emitting layer, an intermediate-layer forming step, a light-emitting-layer forming step and a clad-layer forming step which utilized an MOVPE method specified below were performed continuously. In these MOVPE methods, note that the following were used: trimethyl indium (or TMIn, In$(CH_3)_3$) as an In supply source; trimethyl aluminum (or TMAl, Al$(CH_3)_3$) as an Al supply source; trimethyl gallium (or TMGa, Ga$(CH_3)_3$) as a Ga supply source; ammonia ($NH_3$) as an N supply source; diethyl zinc (or DEZn) as a Zn supply source; and monomethyl silane (or MMSi, $SiCH_3$) as an Si supply source.

Intermediate-Layer Forming Step>

Said intermediate layers 5 were formed on said oriented microcrystal layer 3 of said substrate 4 for forming light-emitting layer (see FIG. 1 (d)) by means of an MOVPE method that was carried out under the following conditions.

| | |
|---|---|
| Substrate Temperature: | 1,200° C. |
| TMAl Supply Amount: | 2 μmol/min. |
| $NH_3$ Supply Amount: | 2 liters/min. |
| Growth Time: | 1 min. |

Light-Emitting-Layer Forming Step>

In succession to said intermediate-layer-forming step, said light-emitting layers 6, which included Si and Zn in predetermined concentrations respectively, were formed on said intermediate layers 5 (see FIG. 1 (e)) by means of carrying out an MOVPE method under the following conditions.

| | |
|---|---|
| Substrate Temperature: | 1,050° C. |
| TMGa Supply Amount: | 17.6 μmol/min. |

-continued

| | |
|---|---|
| NH₃ Supply Amount: | 2.5 liters/min. |
| DEZn Supply Amount: | 10.3 μmol/min. |
| MMSi Supply Amount: | 7.4 nmol/min. |
| Growth Time: | 6 min. |

<Clad-Layer Forming Step>

In succession to said light-emitting-layer-forming step, said clad layers 7 were formed on said light-emitting layers 6 (see FIG. 1 (f)) by means of carrying out an MOVPE method under the following conditions.

| | |
|---|---|
| Substrate Temperature: | 1,050° C. |
| TMAl Supply Amount: | 2 μmol/min. |
| NH₃ Supply Amount: | 2.5 liters/min. |
| Growth Time: | 1 min. |

Thus, the light emitter 8 was produced, light emitter 8 which is directed to the present example comprising: said substrate 4 for forming light-emitting layer; the intermediate layers 5, which were formed on said oriented microcrystal layer 3 of this substrate 4 for forming light-emitting layer; the light-emitting layers 6, which were formed on these intermediate layers 5; and the clad layers 7, which were formed on these light-emitting layers 6.

<Peeling-Off Step>

Finally, integral articles of said intermediate layer 5, light-emitting layer 6 and clad layer 7 were peeled off from said light-emitting-layer forming substrate 4 of the obtained light emitter 8 by means of a wet etching treatment using a mixture solution of hydrofluoric acid and nitrate acid, and thereby the light-emitting substance 9, which is directed to the present example comprising these intermediate layer 5, light-emitting layer 6 and clad layer 7, was obtained (see FIG. 1 (g)).

Example No. 2

Example No. 2 is one which has embodied the invention.

Figure 2:
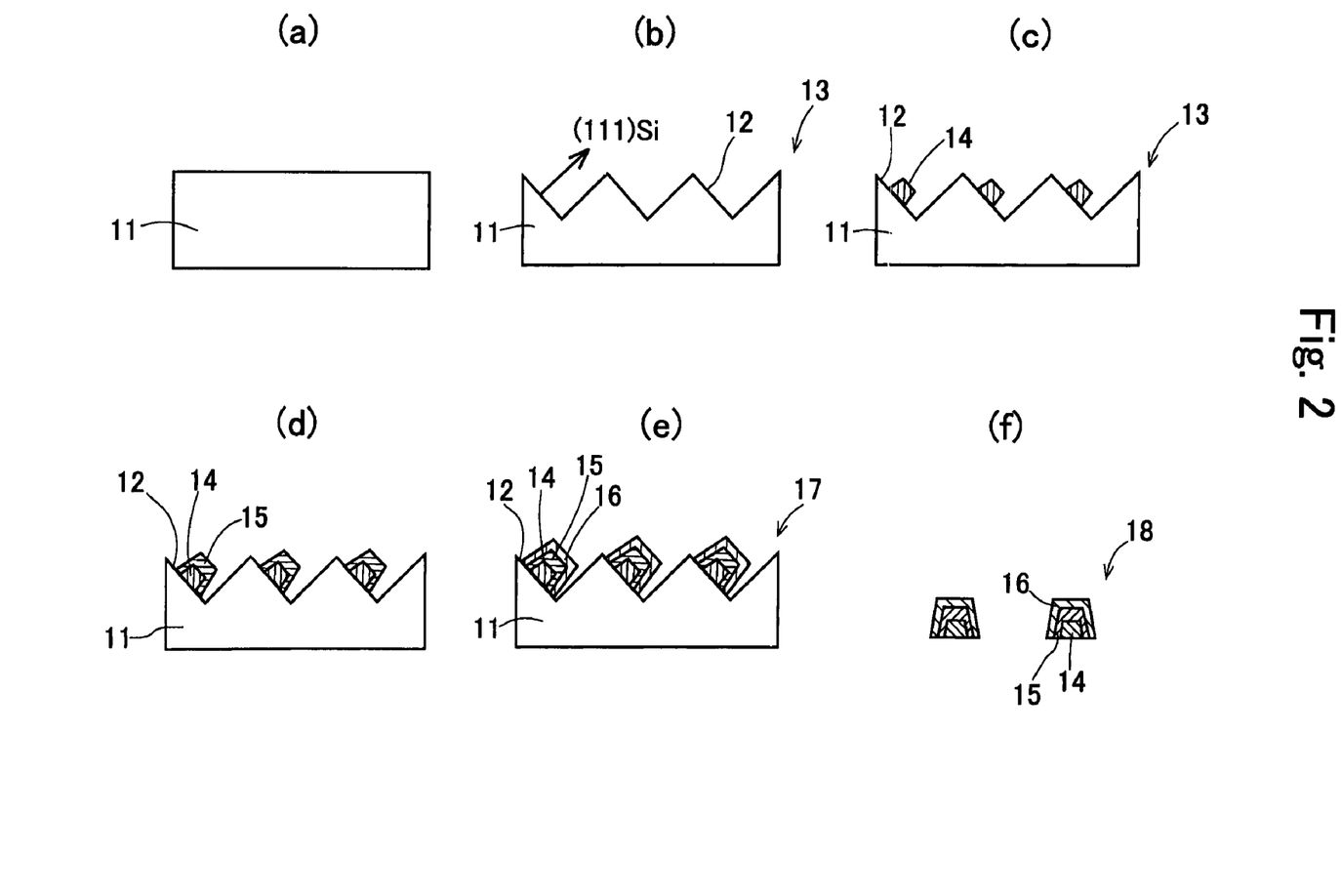
FIG. 2 is directed to Example No. 2 of the present invention, and is cross-sectional views for schematically illustrating production steps of a substrate for forming light-emitting layer, a light emitter and a light-emitting substance.

A substrate 13 for forming light-emitting layer, substrate 13 which is directed to the present example illustrated in the cross-sectional diagram of FIG. 2 (b), is constituted of a single-crystal substrate 11, which comprises an Si single-crystal base plate; and has a plurality of (111) Si-plane portions 12, which are formed by micro fabricating (or anisotropy etching) a surface of this single-crystal substrate 11.

The respective (111) Si-plane portions 12 are such that an average of the lengths of maximal portions is adapted to being 150 nm.

Moreover, a light emitter 17, which is directed to the present example illustrated in the schematic cross-sectional diagram of FIG. 2 (e), is constituted of the following: said substrate 13 for forming light-emitting-layer; a plurality of intermediate layers 14, which are formed on said (111) Si-plane portions 12 of this substrate 13 for forming light-emitting layer by means of vapor-phase growth method, and which comprise a nitride semiconductor; a plurality of light-emitting layers 15, which are formed on the respective intermediate layers 14 by means of vapor-phase growth method respectively, and which comprise a nitride semiconductor; and a plurality of clad layers 16, which are formed on the respective light-emitting layers 15 by means of vapor-phase growth method respectively, and which comprise a nitride semiconductor.

The intermediate layers 14 are those which have a composition formula, AlN, and which include Al as a nucleus substance that becomes a starting point when the light-emitting layers 15 grow. Moreover, the intermediate layers 14 are such that the band-gap energy is adapted to being greater than that of the light-emitting layers 15 and the refractive index is adapted to being smaller than that of the light-emitting layers 15. And, a thickness of these intermediate layers 14 is adapted to be 10 nm approximately.

The light-emitting layers 15 have a composition formula, GaN. The respective light-emitting layers 15 are constituted of single microcrystal grains whose average grain diameter is 150 nm, respectively. Moreover, most of the light-emitting layers 15 are independent of the neighboring light-emitting layers 15 with gaps in between. And, the respective light-emitting layers 15 include Si as a donor impurity in a concentration of $8.0 \times 10^{18}/cm^3$, and includes Zn as an acceptor impurity in a concentration of $4.0 \times 10^{19}/cm^3$.

The clad layers 16 have a composition formula, AlN. Moreover, the clad layers 16 are such that the band-gap energy is adapted to being greater than that of the light-emitting layers 15 and the refractive index is adapted to being smaller than that of the light-emitting layers 15. And, these clad layers 16 are formed in a thickness of 10 nm so as to cover the entirety of the light-emitting layers 15.

Moreover, a light-emitting substance 18, which is directed to the present invention illustrated in the schematic cross-sectional diagram of FIG. 2 (f), is completed by being peeled off from the light-emitting-layer forming substrate 13 of said light emitter 17, and is constituted of said intermediate layer 14, said light-emitting layer 15 and said clad layer 16.

This light-emitting substance 18 is put into such a laminated state that the light-emitting layer 15 is held between the intermediate layer 14 and clad layer 16 whose band-gap energy is greater and refractive index is smaller than those of the light-emitting layer 15. And, an average particle diameter of this light-emitting substance 18 is adapted to being 100-200 nm.

The substrate 13 for forming light-emitting-layer, light emitter 17 and light-emitting substance 18, which are directed to the present example having such constructions, were produced as follows.

<Micro Fabricating Step>

A single-crystal substrate 11, which comprised an Si single-crystal base plate, was prepared (see FIG. 2 (a)). Note that this single-crystal substrate 1 was one whose surface to be processed was not subjected to any polishing treatment, and the like, and had the (001) Si planes 11a whose surface roughness being expressed by mean square height was adapted to being 25 nm.

And, said (011) Si planes 11a were micro fabricated by means of conducting an anisotropy etching treatment with respect to this single-crystal substrate 11 under the conditions specified below, and thereby said (111) Si-plane portions 12 were formed (see FIG. 2 (b)).

| | |
|---|---|
| Type of Anisotropy Etching Solution: | KOH Aqueous Solution |
| Concentration of Anisotropy Etching Solution: | 25% by weight |
| Temperature of Anisotropy Etching Solution: | Constant at 40° C. (±2° C. approximately) |
| Immersion Time: | 7.5 min. |

Thus, the substrate 13 for forming light-emitting layer was produced, substrate 13 which is directed to the present example comprising the Si single-crystal substrate 11 and having a plurality of the (111) Si-plane portions 12.

Next, with respect to the obtained substrate 13 for forming light-emitting layer, an intermediate-layer forming step, a light-emitting-layer forming step and a clad-layer forming step which utilized an MOVPE method specified below were performed continuously. In these MOVPE methods, note that, in the same manner as said Example No. 1, the following were used: TMIn as an In supply source; TMAl as an Al supply source; TMGa as a Ga supply source; $NH_3$ as an N supply source; DEZn as a Zn supply source; and MMSi as an Si supply source.

<Intermediate-Layer Forming Step>

Said intermediate layers 14 were formed on said (111) Si-plane portions 12 of said substrate 13 for forming light-emitting-layer (see FIG. 2 (c)) by means of an MOVPE method that was carried out under the following conditions.

| | |
|---|---|
| Substrate Temperature: | 1,200° C. |
| TMAl Supply Amount: | 2 µmol/min. |
| $NH_3$ Supply Amount: | 2 liters/min. |
| Growth Time: | 1 min. |

<Light-Emitting-Layer Forming Step>

In succession to said intermediate-layer-forming step, said light-emitting layers 15, which included Si and Zn in predetermined concentrations respectively, were formed on said intermediate layers 14 (see FIG. 2 (d)) by means of carrying out an MOVPE method under the following conditions.

| | |
|---|---|
| Substrate Temperature: | 1,050° C. |
| TMGa Supply Amount: | 17.6 µmol/min. |
| $NH_3$ Supply Amount: | 2.5 liters/min. |
| DEZn Supply Amount: | 10.3 µmol/min. |
| MMSi Supply Amount: | 7.4 nmol/min. |
| Growth Time: | 6 min. |

<Clad-Layer Forming Step>

In succession to said light-emitting-layer-forming step, said clad layers 16 were formed on said light-emitting layers 15 (see FIG. 2 (e)) by means of carrying out an MOVPE method under the following conditions.

| | |
|---|---|
| Substrate Temperature: | 1,050° C. |
| TMAl Supply Amount: | 2 µmol/min. |
| $NH_3$ Supply Amount: | 2.5 liters/min. |
| Growth Time: | 1 min. |

Thus, the light emitter 17 was produced, light emitter 17 which is directed to the present example comprising: said substrate for forming light-emitting layer; the intermediate layers 14, which were formed on said (111) Si-plane portions 12 of this substrate for forming light-emitting layer; the light-emitting layers 15, which were formed on these intermediate layers 14; and the clad layers 16, which were formed on these light-emitting layers 15.

<Peeling-Off Step>

Finally, integral articles of said intermediate layer 14, light-emitting layer 15 and clad layer 16 were peeled off from said light-emitting-layer forming substrate 13 of the obtained light emitter 17 by means of a wet etching treatment using a mixture solution of hydrofluoric acid and nitrate acid, and thereby the light-emitting substance 18, which is directed to the present example comprising these intermediate layer 14, light-emitting layer 15 and clad layer 16, was obtained (see FIG. 2 (f)).

Reference Example

As a single-crystal substrate, a (111) Si base plate was prepared. And, utilizing an MOVPE method, a GaN template layer, an AlN buffer layer, and an InGaN light-emitting layer were formed on the (111) Si base plate in this order. In this instance, upon forming the InGaN light-emitting layer, the Zn concentration and Si concentration, which are included in the InGaN light-emitting layer, were modified variously as follows by modifying the supply amounts of Zn and Si variously: Zn: $0.34 \times 10^{19}/cm^3$-$9.2 \times 10^{19}/cm^3$; and Si: $2.3 \times 10^{18}/cm^3$-$9.2 \times 10^{18}/cm^3$. These Zn concentration and Si concentration were measured by means of SIMS (or Secondary Ionization Mass Spectrometer, or secondary ion mass spectrometer).

In the aforementioned MOVPE method, note that, in the same manner as said Example No. 1, the following were used: TMIn as an In supply source; TMAl as an Al supply source; TMGa as a Ga supply source; $NH_3$ as an N supply source; DEZn as a Zn supply source; and MMSi as an Si supply source.

Moreover, a thickness of the GaN template layer was 200 nm, and a thickness of the AlN buffer layer was 50 nm. In addition, the InGaN light-emitting layer was one whose thickness was 200 nm and which had a composition formula, $In_{0.1}Ga_{0.9}N$.

And, how the light-emitting characteristics (i.e., light-emitting intensity or light-emitting efficiency, and the like) changed depending on the Zn concentration and Si concentration, which were included in the InGaN light-emitting layer, was examined.

Figure 3:
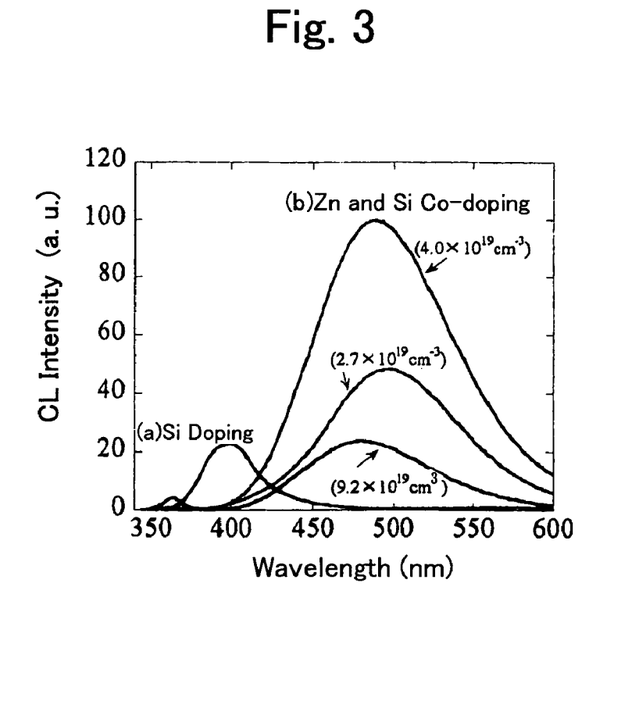
FIG. 3 is directed to a reference example, and is a diagram for illustrating the CL spectra of an InGaN light-emitting layer when making the Si concentration constant at $4.6\times10^{18}$ cm$^3$ and altering the Zn concentration variously.

FIG. 3 is one which the CL (or Cathodoluminescence) spectra (at room temperature) of InGaN light-emitting layer when the Si concentration was made constant at $4.6 \times 10^{18}$ cm$^3$ and the Zn concentration was modified variously. From FIG. 3, the CL spectrum of InGaN light-emitting layer, which was doped with Si alone, was such that the peak wavelength was 400 nm. Moreover, by means of doping Zn along with Si, the CL spectrum of InGaN light-emitting layer was such that the peak wavelength moved to 482 nm. In addition, the InGaN light-emitting layer, which was doped with Si: $4.6 \times 10^{18}/cm^3$ and Zn: $4.0 \times 10^{19}/cm^3$, the light-emitting intensity became 5 times, compared with the case of being doped with Si alone. Further, by means of being doped with Zn along with Si, the width of spectra widened, and thereby broad light-emitting wavelengths were obtained.

Figure 4:
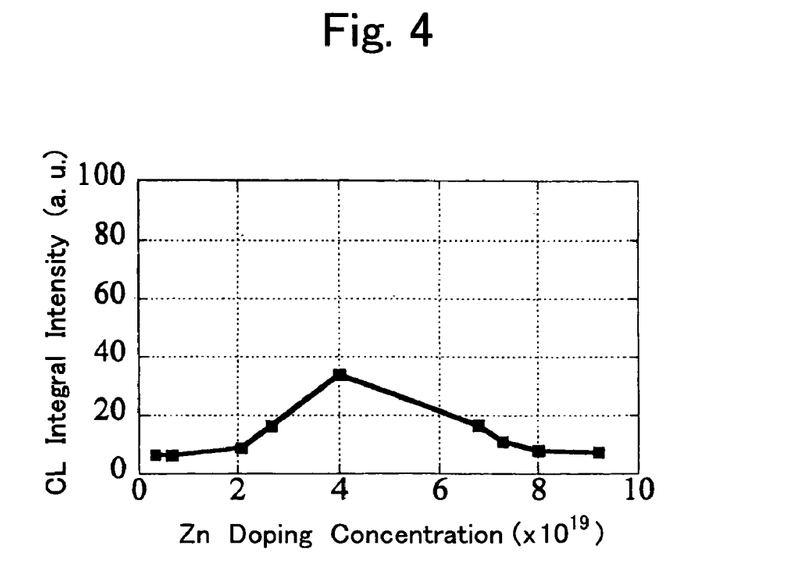
FIG. 4 is directed to a reference example, and is a diagram for illustrating the light-emitting intensity of an InGaN light-emitting layer when making the Si concentration constant at $4.6\times10^{18}$ cm$^3$ and altering the Zn concentration variously.
Figure 5:
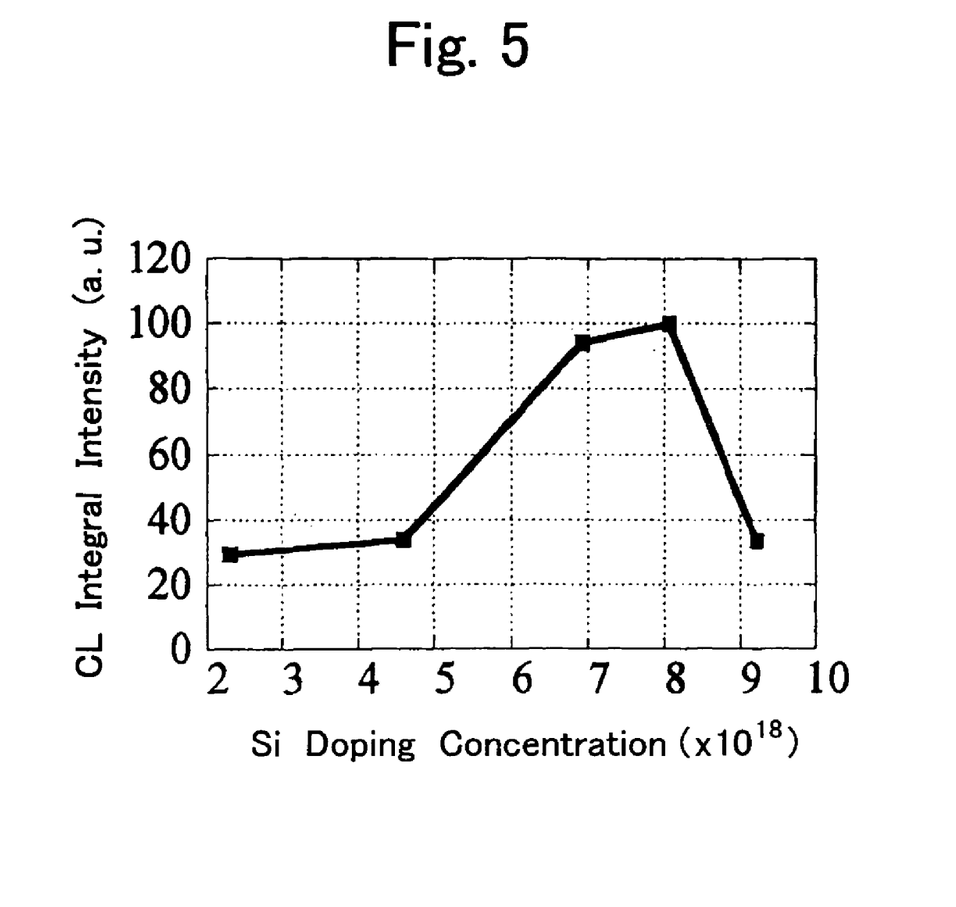
FIG. 5 is directed to a reference example, and is a diagram for illustrating the light-emitting intensity of an InGaN light-emitting layer when making the Zn concentration constant at $4.0\times10^{19}$/cm$^3$ and altering the Si concentration variously.

FIG. 4 is one which the light-emitting intensity of InGaN light-emitting layer when the Si concentration was made constant at $4.6 \times 10^{18}/cm^3$ and the Zn concentration was modified variously. FIG. 5 is one which the light-emitting intensity of InGaN light-emitting layer when the Zn concentration was made constant at $4.0 \times 10^{19}/cm^3$ and the Si concentration was modified variously. From FIG. 4 and FIG. 5, the light-emitting intensity was enlarged by means of being doped with Zn and Si. In other words, in the InGaN light-emitting layer whose compositional formula was $In_{0.1}Ga_{0.9}N$, it was possible to effectively enlarge the light-emitting intensity by including Si as a donor impurity in a concentration of $4.6 \times 10^{18}/cm^3$-$9.2 \times 10^{18}/cm^3$ and by including Zn as an acceptor impurity in a concentration of $2 \times 10^{19}/cm^3$-$8 \times 10^{19}/cm^3$. In particular, the $In_{0.1}Ga_{0.9}N$ light-emitting layer, which included Si in a concentration of $8 \times 10^{18}/cm^3$ and Zn in a concentration of $4 \times 10^{19}/cm^3$ was such that the light-emitting intensity became maximum and thereby became twenty-three times of the light-emitting intensity of the $In_{0.1}Ga_{0.9}N$ light-emitting layer, which included only Si in a concentration of $4.6 \times 10^{18}/cm^3$.

The invention claimed is:

1. A substrate for forming a light-emitting layer, comprising: a single-crystal substrate; an oriented microcrystal layer disposed on the single-crystal substrate; an intermediate layer disposed on the oriented microcrystal layer; a light-emitting layer comprising a nitride semiconductor disposed on the intermediate layer by means of a vapor-phase growth method; and a clad layer disposed on said light-emitting layer, wherein said oriented microcrystal layer contains a plurality of crystals, and a proportion of said crystals, in which one of crystal axes is oriented perpendicular with respect to said single-crystal substrate, is 5-9 out of 10, and an average of the crystal grain diameters of the respective crystals, contained in said oriented microcrystal layer, is 1-1,000 nm; and wherein said light-emitting layer has a band gap energy smaller than that of said intermediate layer and than that of said clad layer.

2. A light emitter equipped with the substrate as set forth in claim 1 for forming the light-emitting layer,
wherein said light-emitting layer comprises microcrystal grains whose average grain diameter is 1-1,000 nm.

3. A light emitter equipped with the substrate as set forth in claim 1 for forming the light-emitting layer, wherein the intermediate layer is formed on said oriented microcrystal layer by means of a vapor-phase growth method, and comprises a nitride semiconductor, comprising a nucleus substance that becomes a starting point when said light-emitting layer grows.

4. A light emitter as set forth in claim 2, wherein the clad layer is formed on said light-emitting layer by means of vapor-phase growth method, and comprises a nitride semiconductor.

5. A light emitter as set forth in claim 2, wherein said light-emitting layer is formed on said oriented microcrystal layer with said respective microcrystal grains distributed in a dotted shape independently.

6. A light emitter as set forth in claim 3, wherein said single-crystal substrate comprises a silicon substrate; said intermediate layer comprises $Al_xGa_yN$ ($x+y=1$, $0<x\leq1$, and $0\leq y<1$); and said light-emitting layer comprises $In_zAl_xGa_yN$ ($x+y+z=1$, $0\leq x\leq1$, $0\leq y\leq1$, and $0\leq z\leq1$).

7. A light-emitting substance peeled off from a substrate for forming a light-emitting layer, the substrate comprising said substrate of the light emitter as set forth in claim 4; and comprising said intermediate layer, said light-emitting layer and said clad layer.

8. A light emitter comprising: a single-crystal substrate; an oriented microcrystal layer disposed on the single-crystal layer; an intermediate layer disposed on the oriented microcrystal layer; a light-emitting layer disposed on the intermediate layer by means of a vapor-phase growth method, comprising a nitride semiconductor; and a clad layer disposed on said light-emitting layer, wherein said oriented microcrystal layer contains a plurality of crystals, and a proportion of said crystals, in which one of crystal axes is oriented perpendicular with respect to said single-crystal substrate, is 5-9 out of 10; an average of crystal grain diameters of the respective crystals, contained in said oriented microcrystal layer, is 1-1,000 nm; said light-emitting layer comprises microcrystal grains having an average grain diameter of 1-1,000 nm, formed on the respective crystals in said oriented microcrystal layer, respectively; and
wherein said light-emitting layer has a band gap energy smaller than that of said intermediate layer and than that of said clad layer.

9. A light emitter as set forth in claim 8, wherein the intermediate layer is formed on said oriented microcrystal layer by means of a vapor-phase growth method, and comprises a nitride semiconductor including a nucleus substance that becomes a starting point when said light-emitting layer grows.

10. A light emitter as set forth in claim 8, wherein the clad layer is formed on said light-emitting layer by means of a vapor-phase growth method, and comprises a nitride semiconductor.

11. A light emitter as set forth in claim 9, wherein said single-crystal substrate comprises a silicon substrate; said intermediate layer comprises $Al_xGa_yN$ ($x+y=1$, $0<x\leq1$, and $0\leq y<1$); and said light-emitting layer comprises $In_xAl_xGa_yN$ ($x+y+z=1$, $0\leq x\leq1$, $0\leq y\leq1$, and $0\leq z\leq1$).

12. A light-emitting substance peeled off from a substrate for forming light-emitting layer, the substrate being said substrate of the light emitter as set forth in claim 10; and comprising said intermediate layer, said light-emitting layer, and said clad layer.

* * * * *